United States Patent
Reykowski et al.

(10) Patent No.: US 10,852,374 B2
(45) Date of Patent: Dec. 1, 2020

(54) MAGNETIC RESONANCE (MR) SYSTEM WITH INCREASED WIRELESS CHANNEL THROUGHPUT AND METHOD OF OPERATION THEREOF

(71) Applicant: KONINKLIJKE PHILIPS N.V., Eindhoven (NL)

(72) Inventors: Arne Reykowski, Newberry, FL (US); Paul Redder, Newberry, FL (US); George Randall Duensing, Gainsville, FL (US); Timothy Ortiz, Alachua, FL (US)

(73) Assignee: Koninklijke Philips N.V., Eindhoven (NL)

( * ) Notice: Subject to any disclaimer, the term of this patent is extended or adjusted under 35 U.S.C. 154(b) by 239 days.

(21) Appl. No.: 15/779,868

(22) PCT Filed: Nov. 28, 2016

(86) PCT No.: PCT/IB2016/057147
§ 371 (c)(1),
(2) Date: May 30, 2018

(87) PCT Pub. No.: WO2017/093873
PCT Pub. Date: Jun. 8, 2017

(65) Prior Publication Data
US 2018/0356478 A1  Dec. 13, 2018

Related U.S. Application Data

(60) Provisional application No. 62/262,411, filed on Dec. 3, 2015.

(51) Int. Cl.
*G01R 33/36* (2006.01)
*H04B 5/00* (2006.01)
(Continued)

(52) U.S. Cl.
CPC ....... *G01R 33/3692* (2013.01); *G01R 33/341* (2013.01); *G01R 33/3642* (2013.01);
(Continued)

(58) Field of Classification Search
CPC .............. G01R 33/3692; G01R 33/341; H04B 5/0031; H04B 5/0081; H04B 7/0689
See application file for complete search history.

(56) References Cited

U.S. PATENT DOCUMENTS 5,666,055 A * 9/1997 Jones ................. G01R 33/3415
324/318
7,764,065 B2   7/2010 Biber et al.
(Continued)

FOREIGN PATENT DOCUMENTS

WO    2007034357 A2    3/2007

OTHER PUBLICATIONS

Shen et al "Design of Digital Wireless Transmission for 64 Channel Array Using IEEE 802.11N" Proceedings of the International Society for Megnetic Resonance in Med. Apr. 19, 2008 p. 1121.
(Continued)

*Primary Examiner* — Dixomara Vargas

(57) ABSTRACT

A magnetic resonance (MR) system, including at least one wireless radio-frequency (RF) coil comprising antennas for receiving induced MR signals and an antenna array comprising transmission and reception antennas; a base transmitter system (BTS) having an antenna array comprising a plurality of transmission and reception antennas configured to communicate with the RF coil using a selected spatial diversity (SD) method; and at least one controller to control the BTS and the RF coil to determine a number of transmission and/or reception antennas available, couple the transmission and reception antennas to form corresponding antenna pairings, and determine signal characteristic infor-
(Continued)

mation (SCI) of the antenna pairings, select an SD transmission method based upon the determined number of antennas and the determined SCI for communication between the BTS and the RF coil, and establish a communication channel between the BTS and the RF coil in accordance with the selected SD transmission method.

18 Claims, 6 Drawing Sheets

(51) Int. Cl.
    *H04B 7/06*     (2006.01)
    *G01R 33/341*     (2006.01)

(52) U.S. Cl.
    CPC .......... *H04B 5/0031* (2013.01); *H04B 5/0081* (2013.01); *H04B 7/0689* (2013.01)

(56) References Cited

U.S. PATENT DOCUMENTS

| | | | |
|---|---|---|---|
| 8,093,900 B2* | 1/2012 | Bennett | G01R 33/3692 |
| | | | 324/307 |
| 8,155,101 B2 | 4/2012 | Van Helvoort et al. | |
| 8,244,192 B2* | 8/2012 | Prasidh | G01R 33/3692 |
| | | | 324/307 |
| 8,258,788 B2 | 9/2012 | Hulbert et al. | |
| 8,831,318 B2 | 9/2014 | Sharif et al. | |
| 8,854,042 B2* | 10/2014 | Vaughan, Jr. | G01R 33/3415 |
| | | | 324/318 |
| 9,449,757 B2* | 9/2016 | John | H02J 5/005 |
| 2002/0193146 A1 | 12/2002 | Wallace et al. | |
| 2009/0140739 A1* | 6/2009 | Bennett | G01R 33/283 |
| | | | 324/318 |
| 2010/0117652 A1 | 5/2010 | Cork et al. | |
| 2011/0124301 A1* | 5/2011 | Prasidh | G01R 33/3692 |
| | | | 455/110 |
| 2012/0249135 A1 | 10/2012 | Albseier et al. | |
| 2013/0184566 A1* | 7/2013 | Kreischer | G01R 33/34084 |
| | | | 600/422 |
| 2014/0148692 A1* | 5/2014 | Hartmann | A61B 17/1703 |
| | | | 600/424 |
| 2014/0361769 A1* | 12/2014 | Hardie | G01R 33/3692 |
| | | | 324/307 |
| 2015/0192651 A1 | 7/2015 | Wiehl | |
| 2016/0056664 A1* | 2/2016 | Partovi | H02J 7/0042 |
| | | | 307/104 |
| 2016/0064994 A1* | 3/2016 | Ku | H02J 7/025 |
| | | | 307/104 |
| 2016/0077175 A1* | 3/2016 | Mori | G01R 33/3692 |
| | | | 324/321 |
| 2016/0338613 A1* | 11/2016 | Beckers | G06F 19/321 |
| 2017/0201363 A1* | 7/2017 | Son | H04B 7/0639 |

OTHER PUBLICATIONS

Molisch et al "MIMO Systems With Antenna Selection—An Overview" Internet Citation Mar. 2004, www.merl.com/papers/docs/tr2004-014.pdf Retrieved Feb. 23, 2006.

\* cited by examiner

MAGNETIC RESONANCE (MR) SYSTEM WITH INCREASED WIRELESS CHANNEL THROUGHPUT AND METHOD OF OPERATION THEREOF

CROSS REFERENCE TO RELATED APPLICATIONS

This application is a U.S. national phase application of International Application No. PCT/IB2016/057147, filed on Nov. 28, 2016, which claims the benefit of U.S. provisional Application Ser. No. 62/262,411 filed on Dec. 3, 2015 and is incorporated herein by reference.

The present system relates to magnetic resonance (MR) systems employing high-throughput wireless communications for communication between an MR system including system controllers and coils and, more particularly, to high-throughput wireless communication systems for MR imaging (MRI) and MR spectroscopy (MRS) systems for transferring data between radio-frequency (RF) coils and the system including system controllers of the MRI system, and methods of operation thereof.

MRI is an imaging technique that uses frequency and phase encoding of protons for image reconstruction. Recently, wireless-type MRI radio-frequency (RF) coils have become available and rely upon wireless communication to transfer acquired information (e.g., image information) to a system controller for further processing, rendering, and/or storage.

More particularly, wireless-type RF coils may include a plurality of transducers (e.g., a transducer array or loops) to acquire MR signals and thereafter sample and digitize the acquired MR signals to form a digitized signal which may include raw MR signals or reconstructed image information. Further, wireless-type RF coils may include an image processing portion (IPP) which may form the reconstructed image information from the acquired MR signals. This digitized signal (either raw or reconstructed) may then be transmitted from one or more coupled antennas to one or more antennas coupled to a system controller for further processing, storage, and/or output on a display of the system.

An advantage of wireless-type RF coils is that they can transmit the digitized information wirelessly and therefore do not require galvanic cables such as RF cables which can introduce signal noise and cause undesirable heating and radiation emissions especially when damaged. Further, physical cables are undesirable from handling, storage, safety and aesthetic viewpoints. Moreover, due to crowded and/or restricted physical environment within a bore of an MR system, line-of-sight (LOS) communication signals between corresponding antennas (e.g., wireless-type RF coil antennas and corresponding controller antennas) may be difficult to establish which may result in diminished image clarity of a reconstructed MR image.

Accordingly, while it may be desirable to use wireless-type RF coils, wireless-type RF coils require high-bandwidth communication which may often exceed 20 Mbps per channel or for example up to 640 Mbps for a 32 channel coil downstream to properly communicate with a system controller. For example, many applications require a high SNR/resolution, such as any high-definition MR procedure including neuro imaging, parallel imaging techniques such as to apply motion correction for example in cardiac imaging, pediatric imaging, etc. As readily appreciated, any application wherein a wireless coil is controlled for imaging, a large amount of data is communicated between the wireless coil and the system controller. Further, with additional overhead for packaging, preambles, error correction and data retransmission, the total required communication channel capacity can be in the excess of 1 Gbps for a 32 channel coil.

In addition, upstream requirements for the transfer of control information to the coils require low latency for proper synchronization. Communication of control information between the corresponding antennas needs to be timely and accurate to properly support the wireless coil during operation. However, since LOS communications cannot be assured between the corresponding antennas, proper control of the wireless coils is difficult.

These communication characteristics are therefore often difficult to establish and/or maintain in an MR environment for many reasons such as system noise, interference, movement of the wireless-type RF and physical constraints. For example, assuming that a signal encoding method can tolerate a Bit-Error-Rate (BER) up to a certain maximum, the channel capacity is limited by bandwidth and signal-to-noise ratio (SNR). For these reasons and others it is difficult to establish wireless communication channels with desired throughput in an MR environment.

Moreover, wireless type RF coils require precise synchronization with a system clock to avoid undesirable image degradation due to artifacts, etc. In addition, latency of communication signals such as control signals should be low and predictable to ensure adequate image capture and coil control.

Accordingly, embodiments of the present system may overcome these and other disadvantages of conventional MRI and MRS systems.

The system(s), device(s), method(s), arrangements(s), user interface(s), computer program(s), processes, etc. (hereinafter each of which will be referred to as system, unless the context indicates otherwise), described herein address problems in prior art systems.

In accordance with embodiments of the present system, there is disclosed a magnetic resonance (MR) system, comprising: at least one wireless radio-frequency (RF) coil comprising antenna loops for receiving induced MR signals and an antenna array comprising transmission (WTx) and reception (WRx) antennas; a base transmitter system (BTS) having an antenna array comprising a plurality of transmission (BTx) and reception (BRx) antennas configured to communicate with the at least one wireless RF coil using a selected spatial diversity (SD) transmission method; and at least one controller configured to control the BTS and the at least one wireless RF coil and: determine a number of at least one of the transmission and reception antennas available for communication between the BTS and the at least one wireless RF coil, couple the plurality of transmission (BTx) and reception (BRx) antennas of the BTS to the transmission (WTx) and reception (WRx) antennas of the at least one wireless RF coil to form corresponding antenna pairings, and determine signal characteristic information (SCI) of each of the antenna pairings, select an SD transmission method for communicating with the at least one wireless RF coil based upon the determined number of transmission and reception antennas and the determined SCI to enable communication of a given type of information between the BTS and the at least one wireless RF coil, and establish at least one communication channel between the BTS and the at least one wireless RF coil in accordance with the selected SD transmission method. The at least one controller may be further configured to determine the selected SD transmission method from at least one of a multiple-input multiple-output (MIMO), a multiple-input single-output (MISO), a single-input multiple-output (SIMO); and a single-input single-output (SISO) transmission methods in accordance with the determined number of antennas at the at least one wireless RF coil for enabling communication between the BTS and the at least one wireless RF coil. The at least one controller may determine whether the number of antennas at the at least one wireless RF coil for enabling communication between the BTS and the at least one wireless RF coil is greater than one.

The at least one controller may be further configured to: select one of the MISO and SISO communication methods when it is determined that the number of available transmission and reception antennas is not greater than one; and select one of the MIMO and SIMO communication methods when it is determined that the number of available transmission and reception antennas is greater than one. The at least one controller may be further configured to classify the available antenna pairings and select antenna pairings based upon the classification of the available antenna pairings. The at least one controller may be further configured to determine a type of information to be transmitted between the BTS and the at least one wireless RF coil and select available antenna pairings with a given classification that is suitable for the determined type of information to be transmitted. One or more antenna pairings classified as line-of-sight may be selected for transmitting real-time-operating-system (RTOS) information and one or more antenna pairing classified as direct path/direct signal, with obstruction may be selected for transmitting high-data-rate (HDR) information In accordance with embodiments of the present system, there is disclosed a method of operating a magnetic resonance (MR) system, the method controlled by at least one controller comprising acts of: receiving induced MR signals from at least one wireless radio-frequency (RF) coil comprising antenna loops and an antenna array comprising transmission (WTx) and reception (WRx) antennas; communicating between the at least one wireless RF coil and a base transmitter system (BTS) having an antenna array comprising a plurality of transmission (BTx) and reception (BRx) antennas using a selected spatial diversity (SD) transmission method; determining a number of at least one of the transmission and reception antennas available for communication between the BTS and the at least one wireless RF coil, coupling the plurality of transmission (BTx) and reception (BRx) antennas of the BTS to the transmission (WTx) and reception (WRx) antennas of the at least one wireless RF coil to form corresponding antenna pairings; determining signal characteristic information (SCI) of each of the antenna pairings; selecting an SD transmission method for communicating with the at least one wireless RF coil based upon the determined number of transmission and reception antennas and the determined SCI to enable communication of a given type of information between the BTS and the at least one wireless RF; and establishing at least one communication channel between the BTS and the at least one wireless RF coil in accordance with the selected SD transmission method. The method may include an act of determining the selected SD transmission method from at least one of a multiple-input multiple-output (MIMO), a multiple-input single-output (MISO), a single-input multiple-output (SIMO); and a single-input single-output (SISO) transmission methods in accordance with the determined number of antennas at the at least one wireless RF coil for enabling communication between the BTS and the at least one wireless RF coil. The method may include one or more acts of determining whether the number of antennas at the at least one wireless RF coil for enabling communication between the BTS and the at least one wireless RF coil is greater than one, selecting one of the MISO and SISO communication methods when it is determined that the number of available transmission and reception antennas is not greater than one, and selecting one of the MIMO and SIMO communication methods when it is determined that the number of available transmission and reception antennas is greater than one. The method may include one or more acts of classifying the available antenna pairings, selecting antenna pairings based upon the classification of the available antenna pairings, determining a type of information to be transmitted between the BTS and the at least one wireless RF coil, selecting available antenna pairings with a given classification that is suitable for the determined type of information to be transmitted, selecting one or more antenna pairings classified as line-of-sight for transmitting real-time-operating-system (RTOS) information, and selecting one or more antenna pairing classified as direct path/direct signal, with obstruction for transmitting high-data-rate (HDR) information.

In accordance with embodiments of the present system, there is disclosed a computer program stored on a computer readable non-transitory memory medium for a magnetic resonance (MR) system, the computer program comprising computer program instructions that when executed by a processor cause the processor to perform a method comprising acts of: receiving induced MR signals from at least one wireless radio-frequency (RF) coil comprising antenna loops and an antenna array comprising transmission (WTx) and reception (WRx) antennas; communicating between the at least one wireless RF coil and a base transmitter system (BTS) having an antenna array comprising a plurality of transmission (BTx) and reception (BRx) antennas using a selected spatial diversity (SD) transmission method; determining a number of at least one of the transmission and reception antennas available for communication between the BTS and the at least one wireless RF coil; coupling the plurality of transmission (BTx) and reception (BRx) antennas of the BTS to the transmission (WTx) and reception (WRx) antennas of the at least one wireless RF coil to form corresponding antenna pairings; determining signal characteristic information (SCI) of each of the antenna pairings; selecting an SD transmission method for communicating with the at least one wireless RF coil based upon the determined number of transmission and reception antennas and the determined SCI to enable communication of a given type of information between the BTS and the at least one wireless RF coil; and establishing at least one communication channel between the BTS and the at least one wireless RF coil in accordance with the selected SD transmission method. The computer program may include an act of determining the selected SD transmission method from at least one of a multiple-input multiple-output (MIMO), a multiple-input single-output (MISO), a single-input multiple-output (SIMO); and a single-input single-output (SISO) transmission methods in accordance with the determined number of antennas at the at least one wireless RF coil for enabling communication between the BTS and the at least one wireless RF coil.

The processor when executing the program may further perform one or more acts of determining whether the number of antennas at the at least one wireless RF coil for enabling communication between the BTS and the at least one wireless RF coil is greater than one; selecting one of the MISO and SISO communication methods when it is determined that the number of available transmission and reception antennas is not greater than one; and selecting one of the MIMO and SIMO communication methods when it is determined that the number of available transmission and reception antennas is greater than one. The computer program may include one or more acts of classifying the available antenna pairings, selecting antenna pairings based upon the classification of the available antenna pairings, determining a type of information to be transmitted between the BTS and the at least one wireless RF coil, selecting available antenna pairings with a given classification that is suitable for the determined type of information to be transmitted, selecting one or more antenna pairings classified as line-of-sight for transmitting real-time-operating-system (RTOS) information, and selecting one or more antenna pairing classified as direct path/direct signal, with obstruction for transmitting high-data-rate (HDR) information.

The present invention is explained in further detail in the following exemplary embodiments and with reference to the figures, where identical or similar elements are partly indicated by the same or similar reference numerals, and the features of various exemplary embodiments being combinable. In the drawings.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, etc., up to all of the recited elements may be present) in a system in accordance with the claims recitation and in accordance with one or more embodiments of the present system.

Embodiments of the present system provide a wireless-type communication system which increases wireless channel capacity using spatial diversity (SD) (hereinafter diversity methods) methods such as a Multiple-Input-Multiple-Output (MIMO) method which may use signals which may propagate using spatial diversity along the same channel or channels using the same frequency and bandwidth but having different spatial distributions. Embodiments of the present system may employ spatial diversity methods to generate spatially orthogonal streams of data shaping orthogonal sets of data using any suitable method such as, for example, by generating data streams with different degrees of optical angular momentum (OAM), and/or shaping orthogonal sets of transmit beams. Embodiments of the present system utilizes transmission characteristics between control and image transmitting and receiving antennas (e.g., antenna pairs) to select antennas for communication to enable deterministic control (e.g., timely arrival of control information) of the wireless-type RF coils while also supporting wireless transfer of image information from the wireless-type RF coils to a system controller.

Figure 1:
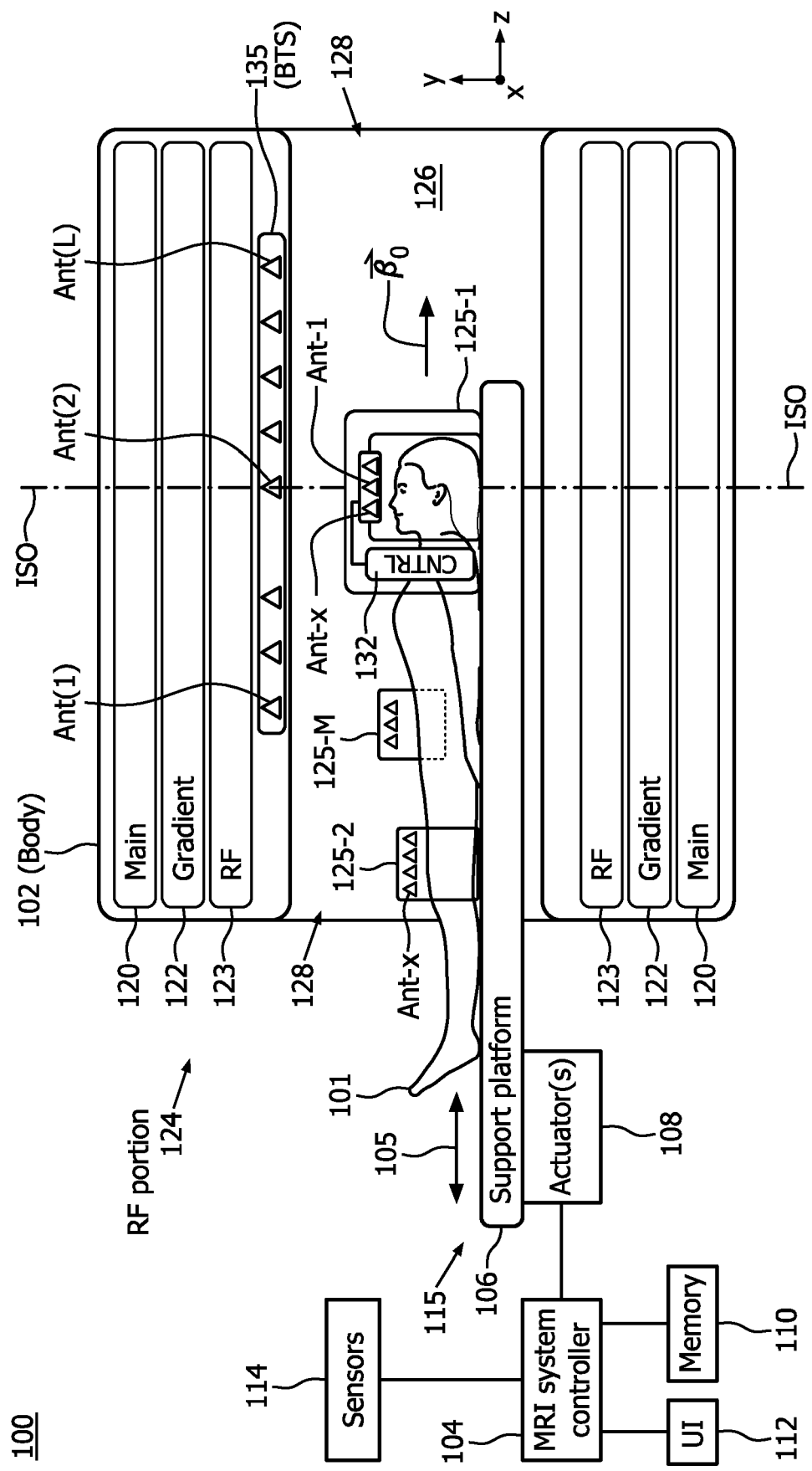
FIG. 1 shows a schematic block diagram of a portion of an MR system in accordance with embodiments of the present system.

FIG. 1 shows a schematic block diagram of a portion of an MR system 100 (hereinafter system 100 for the sake of clarity) in accordance with embodiments of the present system. The system 100 may include one or more of a body 102, an MRI system controller (controller) 104, a support portion 115, a memory 110, a user interface (UI) 112, and sensors 114. The controller 104 may control the overall operation of the system 100.

The body 102 may include one or more of a main magnet 120 having a bore 126 (e.g., a main bore), gradient coils 122, and an RF portion 124 one or more of which may operate under the control of the controller 104. The body 102 may include open- or closed-type MRI bodies (e.g., corresponding with open-type or closed-type MRI systems, respectively). However, for the sake of clarity, a closed-type MRI body (e.g., having the scanning volume located within the bore 126, will be discussed). The following discussion should also be understood to apply to open-type MRI bodies. The body 102 may further include at least one opening 128 which may lead to the bore 126. However, in open-type MRI systems the scanning volume may be outside of a bore of a main magnet which may be an open-type main magnet.

The main magnet 116 may include one or more main magnets which may generate a main magnetic field ($B_0$) which may be substantially homogeneous within the scanning volume and may be controlled by the controller 104. The RF portion 124 may include one or more RF coils such as RF coils 123 and 125. More particularly, the RF coils 123 may include a transmit and/or receive (TRX) RF coil that may include fixed and/or hard-wired RF coils. The RF coils 125 may include one or more wireless RF coils (WRFs) 125-$x$ as may be discussed herein. The WRFs 125 may include one or more WRFs such as WRFs 125-1 through 125-M (generally 125-$x$), where M is an integer. One or more of the RF coils (e.g., 123 and/or 125-$x$) may be selected depending upon, for example, type of data transmitted, deterministic timing requirements, system settings, supported communication method(s), number of available antennas for communication, quality of communication between antennas, etc. as described further herein. For the sake of clarity, it will be assumed that each of the WRFs 125-x may be similar to each other. Accordingly, a description of only one of the WRFs 125-x may be provided unless the context indicates otherwise. However, without limitation, it should be assumed that one or more of the WRFs 125-x may be the same as or different from each other. For example, one or the WRFs 125-x may be a 4 channel knee coil while another may be a 32 channel head coil, etc.

The gradient coil 122 may include at least one coil which may generate one or more gradient fields (e.g., gradient excitation pulses) along one or more axes (e.g., $G_x$, $G_y$, and $G_z$) under the control of the controller 104. These gradient fields may form at least part of an encoding sequence that may be applied within at least a portion of the scanning volume to an object-of-interest (OOI) such as a patient 101.

A base transceiver station (BTS) 135 may selectively communicate with one or more of the WRFs 125-x during operation such as before a scan, during a scan and/or after a scan. The BTS 135 may include a plurality of antennas such as L antennas (e.g., ANT(1) through ANT(L), (generally ANTs), where L is an integer, for selectively communicating with one or more antennas of one or more of the WRFs 125-x in accordance with embodiments of the present system. With regard to the L antennas, these antennas together may form an antenna array (AA). Assuming that all of the ANTs of the AA form a group, one or more of these ANTs may be grouped together to form a subgroup of the group of antennas of the AA. An antenna selector (SEL) may be provided to select antennas ANTs (e.g., to form groups, subgroups, or a single antenna) which may be used for communication with corresponding WRFs 125-x during a scan. In accordance with some embodiments, one or more selected antennas ANTs of the BTS 135 may communicate with one or more selected antennas ANTs of the selected WRFs 125-x and may for example form an antenna pairing (pair).

In accordance with embodiments of the present system, one or more of the antennas ANTs of the BTS 135 may be used for aligning portions of the WRFs 125-x. For example, a receive antenna ANT-2 of the BTS 135 may receive a location signal (e.g. that is transmitted from a wireless type RF coil via an ANT-1 as will be described below) and may provide this signal to the controller 104 for further processing such as to determine the location of the ANT-1 of the WRF 125-1 relative to the ISO and/or to align the ANT-1 with the ISO. Methods to determine location of an antenna of an RF coil are discussed in co-pending U.S. Patent Application No. 15/772,250 ("the 15/772,250 application"), the contents of which are incorporated herein by reference.

With regard to alignment, one or more of the antennas (e.g., ANT-2) of the BTS 135 may be located substantially at a desired location such as an iso-center axis (ISO) of the main magnetic field ($B_0$) of the system 100. For the sake of clarity, this antenna may be referred to as an ISO-antenna. The iso-center axis (ISO) may be defined as an axis or plane which may be substantially normal to the main magnetic field ($B_0$) of the system 100. In accordance with embodiments of the present system, the ISO-antenna may receive a location signal transmitted from a selected WRF 125-x for alignment with the iso-center axis (ISO) as may be described for example in the 15/772,250 application.

The one or more of the antennas ANTs of the BTS 135 may be located at, or adjacent to, the bore 126 of the main magnet 120. For example, in accordance with embodiments of the present system, one or more of the antennas ANTs of the BTS 135 may be coupled to an interior surface of the body 102 within the main bore 126. However, it is also envisioned that one or more antennas of the BTS 135 may be located outside of the main bore 126 and/or body 102.

The BTS 135 may be coupled to the controller 104 using any suitable method so as to enable communication with the controller 104. Accordingly, signals received from the controller 104 for transmission may be transmitted via one or more antennas (e.g., all or selected antennas ANTs) of the BTS 135 and signals received from one or more or more antennas (e.g., all or selected antennas) ANTs of the BTS 135 may be transmitted to the controller 104 for further processing.

The TRX RF coil 123 may receive RF sequence signals for transmission from the controller 104 and may emit corresponding RF fields (e.g., RF excitation pulses which may form part of an RF encoding sequence which may form part of the encoding sequence). The TRX RF coil 123 may further receive induced MR signals from the patient 101 and may provide these signals to the controller (in raw or processed form) and/or may process these signals to reconstruct image data and provide the reconstructed image information to the controller 104 for further processing.

The WRFs 125-x may include any suitable mobile coil or coils such as wireless-type digital RF coils which may be mobile coils. The location of one or more of the WRFs 125-x may be directly or indirectly controlled by the controller 104. For example, one or more of the WRFs 125-x may be coupled to, or otherwise rest upon, the support portion or portions thereof such as a support platform 106 (e.g., a patient support) as will be discussed below. However, it is also envisioned that one or more of the WRFs 125-x may be coupled to rails and/or to the user 101 during operation. For example, when operating as a volume coil such as head, knee, shoulder coil, etc., a WRF 125-x may rest upon the support platform 106 and surround a corresponding body part of the patient 101 that is to be scanned (e.g., a knee, a head, a shoulder, etc.). It is also envisioned that the one or more of the WRFs 125-x may be located on rails so that the corresponding WRFs 125-x position within the main bore 126 may be adjusted manually and/or automatically under control of the controller 104. These rails may be situated within the bore 126 and may be parallel to the main magnetic field ($B_0$) or z axis as shown.

One or more of the WRFs 125-x may include planer- and/or volume-type RF coils and may include one or more coil arrays that may include one or more receive loops tuned to receive induced MR signals from the patient 101 and generate corresponding signals such as image signals for further processing. One or more of the WRFs 125-x may include one or more channels (CH) each of which may be associated with a corresponding receive loop or loops of the coil array to receive induced MR signals from the patient 101 during a scan.

One or more of the WRFs 125-x may be the same as or different from each other. For example, the WRF 125-1 may be a head coil, the WRF-2 may be a knee coil and the WRF 125-M may be a shoulder coil. Further, each of the WRFs 125-x may have the same or a different number of antennas ANTx for communicating with the controller 104 via the BTS 135. In accordance with some embodiments, each WRF 125-x may identify to the controller antennas that may be available for establishing communication with the BTS 135 in uplink and/or downlink directions.

For the sake of clarity, it will be assumed that each of the WRFs 125-x may be similar to each other. Accordingly, and without limitation, embodiments of the present system may be described with reference to only a single WRF 125-1 for the sake of clarity. The operations performed with reference to the WRF 125-1 may be performed similarly by adding and/or substituting one or more other WRFs 125-x.

The WRF 125-1 may include one or more of a controller 132, an RF coil array, a memory, and at least one antenna ANT such as ANT-1. The one or more antennas may be transmit and/or receive antennas and may be grouped and/or subgrouped when more than one is available to form an antenna array.

The controller 132 may control the overall operation of the WRF 125-1. The WRF 125-1 may receive induced MR signals from the patient 101 and may reconstruct these signals to generate reconstructed MR information which may include, for example, image and/or spectrographic information. The reconstructed MR information may then be provided to the controller 104. However, it is also envisioned that the WRF 125-1 may provide signals related to the induced MR signals in any suitable format (e.g., raw digitized, etc.) to the controller 104 for further processing and/or reconstruction. Thus, reconstruction may be performed locally in the WRF 125-1 and/or remotely from the WRF 125-1.

The WRF 125-1 may communicate with the controller 104 using any suitable transmission method such as a spatial diversity method. For example, the WRF 125-1 may communicate with the controller 104 using at least one of a multiple-input multiple-output (MIMO), a multiple-input single-output (MISO), a single-input multiple-output (SIMO); and a single-input single-output (SISO) transmission methods. One or more of these communication methods may be selected in accordance with a number of transmission and/or reception antennas ANTs available for, or selected for, communication between the WRF-1 125-1 and the BTS 135. However, it is also envisioned that communication methods may be selected in accordance with system characteristics, operating parameters, scan types, system settings, and/or communication characteristics such as line-of-sight (LOS) between the WRF 125-x and the controller 104. For example, communication characteristics may include channel knowledge such as a priori information on the number and/or type of wireless communication methods, antennas, groups, etc., available.

With regard to the system scan types, each scan type (e.g., knee scan, head scan, shoulder scan, ankle scan, torso scan, etc.) may have a corresponding communication method or methods associated therewith and stored in a memory of the system for further use. Similarly, system settings may be set by the system and/or user and may define a scan type for use. The system settings may be set/reset by a user and/or stored in a memory of the system for further use. The system characteristics may set forth a type of BTS 135 (e.g., number of transmission and/or reception antennas for communicating with a WRF 125-x) and a type WRF 125-x (e.g., number of transmission and/or reception antennas for communicating with a BTS).

In an embodiment wherein the knowledge is not known before placement of the WRF 125-x, the controller 104 may query the BTS 135 and/or the WRF(s) 125-x to determine the operating characteristics (e.g., which may include information related to types of spatial diversity methods supported (e.g., SISO, MISO, SIMO, or MIMO communication methods)) prior to performing a scan and/or this information may be entered and/or otherwise be provided (e.g., stored in a memory) in accordance with a scan type (e.g., head scan, use MIMO communication, etc.).

In accordance with yet other embodiments, a default communication method (e.g., MIMO) may be set by the system and/or user and stored in a memory of the system for further use. With regard to operating parameters, when for example the system detects that one or more antennas are inoperative and/or cannot receive a signal beyond a threshold throughput, quality, bit-error-rate (BER), etc. (e.g., indicating that a transmission path to the corresponding antenna is blocked which would indicate that the path is not line-of-sight (LOS)), the system may switch and/or otherwise select antennas (ANTs) so that one or more other antennas and/or groups of antennas may be selected to support a selected communication method (e.g., SISO, MISO, SIMO, or MIMO), threshold communication rate, etc.

The support portion 115 may include a support platform 106 and at least one actuator 108 that may control a position of the support platform 106. The support portion 106 may support the patient 101 for scanning and may be positioned by the at least one actuator 108 under the control of the controller 104. Accordingly, the support portion 106 may position the patient and the WRF 125-x in a desired position and/or orientation such as within an iso-center of an MR field within the bore 126 of the magnet 120 under the control of the controller 104 such that at least a portion of the patient 101 may be scanned at a desired location. One or more of the WRFs 125-x may be selected based upon their position(s) relative to portions of the system such as the ISO during a scan or vice versa.

The at least one actuator 104 may include any suitable source such as electric motors (e.g., linear, rotational, stepper, etc.), pneumatic actuators, and/or hydraulic actuators which may position the support portion 106 in a desired location under the control of the controller 104. For example, at least one actuator 108 may move the support portion 106 along the one or more axes such as the z axis as illustrated by arrow 105 under the control of the controller 104.

During operation, the controller 104 may be operative to generate an encoding sequence (which may include the gradient and/or the RF excitation pulses) that may be applied to the patient 101 within the scanning volume. In response to application of the encoding sequence, the patient 101 may emit MR signals which may be received by the RF portion 124 such as by the WRF 125-x.

The WRF 125-x may then digitize the received induced MR signals to form digitized MR information. In accordance with embodiments of the present system, the WRF 125-x may compress the digitized MR information so as to form a compressed data stream. Forward error correction may be added to the data stream compressed or otherwise to reduce an overall Bit-Error-Rate (BER) and allow for the detection of non-correctable bit errors in the data stream. The data stream, such as compressed, error-corrected, etc., data steam may then be transmitted within, for example, data packets to a receiver in accordance with a suitable wireless transmission method such as the IEEE 802.11 specification. In accordance with embodiments, the wireless transmission method may employ spatial diversity methods in accordance with embodiments of the present system. Given sufficient channel capacity, further BER improvements may be possible for example through retransmission of corrupted data packets. Embodiments of the present system may size data packets such that a data stream may support high-data-rate data and deterministic data.

As the image quality requirements for MRI may be very high, so are the fidelity requirements for wireless digitized MR data which may result in a limited channel capacity, assuming that signal encoding methods used by embodiments of the present system may tolerate a certain maximum BER prior to encoding, and further assuming that a transmission channel has a certain bandwidth and signal-to-noise ratio (SNR). To satisfy the fidelity requirements, the present system provides a system to increase the channel capacity, such as by increasing the number of RF signals may be transported, and/or further improving the fidelity of those signals as described further herein.

The sensors 114 may sense one or more various conditions and/or parameters of the system such as transmit and/or receive power of one or more of the ANTx, channel state information (CSI), location of the support platform 106, position of the at least one actuator 108, system parameters, etc. For example, the sensors 114 may include location sensors which may sense location of the support platform relative to a fixed reference (e.g., the ISO) and provide this information to the controller 104 for further processing. In this sense, the ANTx may also operate as one or more sensors for determining information for example on transmit/receive power, etc. The controller 104 may then selectively communicate with and/or control one or more of the WRF 125-x base upon the determined location. Thus, as each WRF 125-x enters a desired location for scanning, the controller 104 may be operative to control one or more of the WRFs 125-x to acquire induced MR information that may be used for reconstruction.

Figure 2:
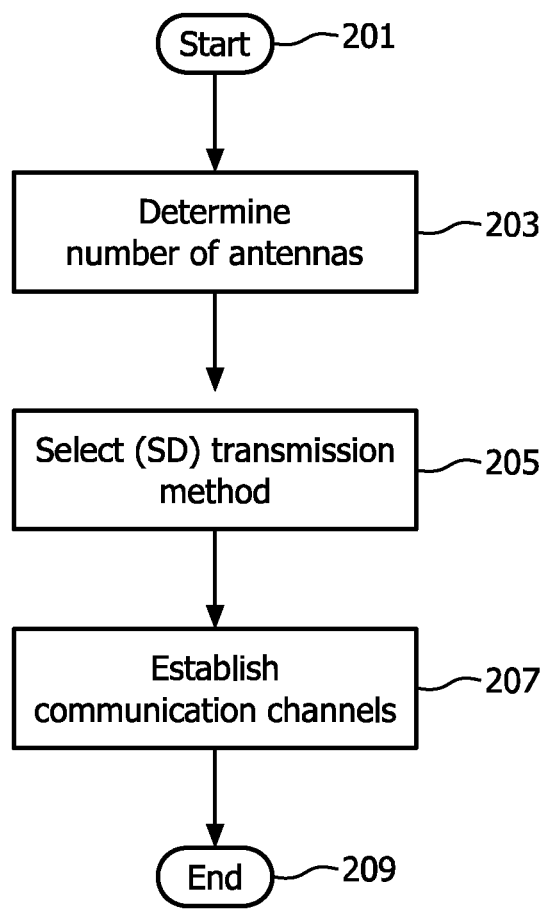
FIG. 2 shows a functional flow diagram of a process that may be performed in accordance with embodiments of the present system.

FIG. 2 shows a functional flow diagram of a process 200 that may be performed in accordance with embodiments of the present system. The process 200 may be performed using one or more computers communicating over a network and may obtain information from, and/or store information to one or more memories which may be local and/or remote from each other. The process 200 may include one or more of the following acts and may be operative to establish a communication method between a BTS and one or more WRFs in accordance with embodiments of the present system. Further, one or more of these acts may be combined and/or separated into sub-acts. Further, one or more of these acts may be skipped depending upon settings. In operation, the process may start during act 201 and then proceed to act 203.

During act 203, the number of antennas available for communication (such as SD communication) may be determined between a base transmitter system (BTS) and at least one wireless radio-frequency coil (WRF) for one or more of uplink and downlink channels. However, for the sake of simplicity, it is assumed that the uplink and downlink channels may use similar settings and transmission methods unless the context indicates otherwise. In accordance with embodiments of the present system, uplink and downlink channels may use different settings and/or transmission methods. In accordance with embodiments of the present system, the BTS and/or the WRF may be queried to obtain this information although, in accordance with embodiments, this information may also be known previously (e.g., be previously stored in a memory) and/or may be determined through communication between antennas as discussed herein.

In response to the query in an embodiment wherein the query is provided, the BTS and/or the at least one WRF may provide information related to the number of antennas available for communication in one or more of the uplink and downlink channels. Once this information is obtained, the process may store it in a memory of the system for later use. Similarly, it is also envisioned that the process may obtain this information from a memory of the system such as from a system configuration information table as may be discussed with reference to Table 1 below.

TABLE 1

| System Configuration Information | | | | | | |
|---|---|---|---|---|---|---|
| RF coils | | | | | | |
| Select (default) | Scan Type | WRF (Coil) | Type | Transmit Antennas | Receive Antennas | SD supported |
|  | Head | Head Coil (rigid) | I | 1 | 2 | Yes |
| X | Head | Head Coil (flexible) | II | 2 | 2 | Yes |
|  | Knee | Knee Coil | II | 2 | 2 | Yes |
| ... | ... | ... | ... | ... | ... |  |
|  | Shoulder | Shoulder Coil | I | 1 | 2 | Yes |
|  | Ankle | Ankle Coil | II | 1 | 2 | Yes |
| BTS | | | | | | |
| Transmit Antennas | | Receive Antennas | | SD Supp. | | |
| 2 | | 2 | | Yes | | |

With regard to Table 1, system configuration information may be defined for one or more the RF coils (e.g., WRFs) and/or for the BTS. With regard to the RF coils, these coils may be selected in accordance with a scan type. In accordance with embodiments of the present system, in a case wherein a scan type has two or more WRFs, one or more of these WRFs may be selected as a default WRF as illustratively shown by the "x" in Table 1. The system may then use the settings for the system configuration information corresponding to the selected and/or default WRF. The type of coil may include an identifier such as type I, type II, etc., which may identify a coil transmission type for example to enable cross-referencing. For example, coils of the same transmission type may have the same number of transmit and/or receive antennas which may be predefined. A spatial diversity (SD) column, may indicate whether the corresponding coil supports spatial diversity. For each coil a number of transmit and/or receive antennas may be listed as illustratively shown though other numbers may be similarly defined. With regard to the BTS, a number of transmit and/or receive antennas may be provided as shown by way of illustration. It is also envisioned that supported MIMO communication modes may be listed. The system configuration information may be updated by the system (e.g., upon discovering new WRFs, etc.) and/or by a user. The (updated) system configuration may then be stored in a memory of the system for use.

In accordance with yet other embodiments, the system may determine (e.g., via a user setting and/or a query) a type (as shown in the type column of Table 1) of at least one of the WRFs used for a current scan and may then, determine the number of antennas and/or type of antennas available at the at least one WRF based upon the type information. Accordingly, the antenna information may associate WRF transmission type information (e.g., type 1 head coil associated with 1 antenna, type 2 head coil associated with 2 antennas, type 3 head coil associated with 5 antennas, type 4 antennas do not support SD, etc.) such that for one or more types of WRF, corresponding antenna number and/or type may be determined. The types may be user defined and/or system defined.

It is further envisioned that a user may select a number of antennas to use for communication during a scan for each of the BTS and/or WRF(s) that may be less than or equal to a number of antennas available at the corresponding BTS and/or WRF(s) depending upon user settings. For example, a user may select two antennas, three antennas, a single antenna, etc., for transmission. It is further envisioned that the process may, depending upon settings, select a default antenna configuration in accordance with the default antenna setting obtained from the antenna information. For example, a user may select certain antennas (e.g., upper array, lower array, a number of antennas, etc.) for transmission. After completing act 203, the process may continue to act 205

During act 205, the process may select an SD transmission method (e.g., which may be referred to as an SD mode) for establishing communication between the BTS and the at least one WRF using any suitable method. The SD transmission methods may include, for example, SISO, SIMO, MISO, and MIMO communication methods. For example, the process may obtain SD transmission information for selecting an SD communication method from a memory of the system which set forth predefined SD communication methods and/or settings for example based upon a determined number of antennas and/or transmission capabilities for at least one of the BTS and the WRFs. The process may select an SD communication method for each corresponding WRF used during a scan (e.g., head coil, shoulder coil, knee coil, ankle coil, etc.) based upon the SD transmission information and a number of antennas available for communication at one or more of the BTS and the corresponding WRF(s). Further, the SD transmission pairs may be classified (e.g., line-of-sight, etc.) and antenna pairs may be selected together with the selection of the SD communication method based on the classification and type of information to be transmitted as discussed herein. However, for the sake of clarity, only a single WRF is discussed in further details though is understood may similarly apply to one or more other WRFs when more than one is selected or otherwise available.

The SD transmission information may be stored in SD mode table in a memory of the system and may include information related to number and/or types of antennas available at one or more of the BTS and/or at least one WRF and corresponding SD communication methods as shown in Table 2 below. The SD transmission information may also include coil type information (coil type I, coil type II).

TABLE 2

SD MODE TABLE

Antenna Information
Number of Antennas

| BTS Transit/Receive | WRF Transmit/Receive | SD Communication Method |
|---|---|---|
| 1/1 | 1 | SISO |
| 1/1 | 2+/2+ | SIMO |
| 2+/2+ | 1/1 | MISO |
| 2+/2+ | 2+/2+ | MIMO |
| Default | 1/1 | MISO |
| Default | 2+/2+ | MIMO |
| Default | Type 1 | MISO |
| Default | Type 2 | MIMO |

With reference to Table 2, it is seen that when the BTS has 1 transmit and 1 receive antenna and the WRF has 2 antennas for transmission and reception (2+/2+), the selected SD communication method (mode) may be determined to be a SIMO communication method. Similarly, when the BTS has 2 or more transmit and receive antennas and the WRF has 2+ transmit and receive antennas, the selected SD communication method (mode) is a MIMO communication method. The process may select communication methods for each of transmit and/or receive (e.g., uplink and downlink) communications.

For the sake of clarity, it may be assumed that the number of antennas available for uplink and downlink channels at the BTS and the WRF are the same. However, without limitation, it is envisioned that the number of transmit and receive antennas may differ from each other. The process may then match an SD communication method (e.g., SIMO, SISO, MISO, MIMO) by matching antennas and/or selecting a highest capacity communication method from those that may be supported by the available antennas. For example, when only a single transmit antenna is available and only a single receive antenna is available for a downlink channel, the process may select a SISO (SD) communication method for this communication channel. However, when two or more receive antennas are available for the receive channel, the process may select a SIMO (SD) communication method for the downlink channel. SD communication method types are illustrated with reference to FIG. 4A through FIG. 4D discussed in more detail below.

The antenna information may further include one or more default antenna settings for the BTS and/or the WRF(s). For example, the default antenna setting may set the number of antennas of the BTS (as shown) and/or WRF equal to 2, etc. Then, in the default setting, in a case wherein the WRF has two antennas, the selected SD communication method may illustratively be a MIMO communication method as shown in Table 2. The default antenna setting may be set by the user and/or system. Further, with regard to type information WRFs may be identified by a unique identifier and/or type such as type I, II, etc., coils each type may identify a number of antennas available, types of communication supported, groupings of antennas, etc., for an SD communication. After completing act 205, the process may continue to act 207.

During act 207, the process may establish at least one communication channel between the BTS and the WRF in accordance with the selected SD transmission method for corresponding ones, groups, etc., of the uplink and/or downlink communication channels. For example, when the selected SD transmission method is a MIMO transmission method for each of the uplink and downlink channels, the process may establish MIMO communication channels between the corresponding WRF and the BTS for the uplink and downlink channels. In this illustrative way, digital data may be transmitted using bidirectional transmission methods between BTS and the WRF and establish bidirectional communication between the system controller and the corresponding WRF. It is also envisioned that in other embodiments, the uplink and downlink channels may employ SD communication methods that are different from each other (e.g., MISO uplink and MIMO downlink). After completing act 207, the process may continue to act 209 where it ends.

Figure 3:
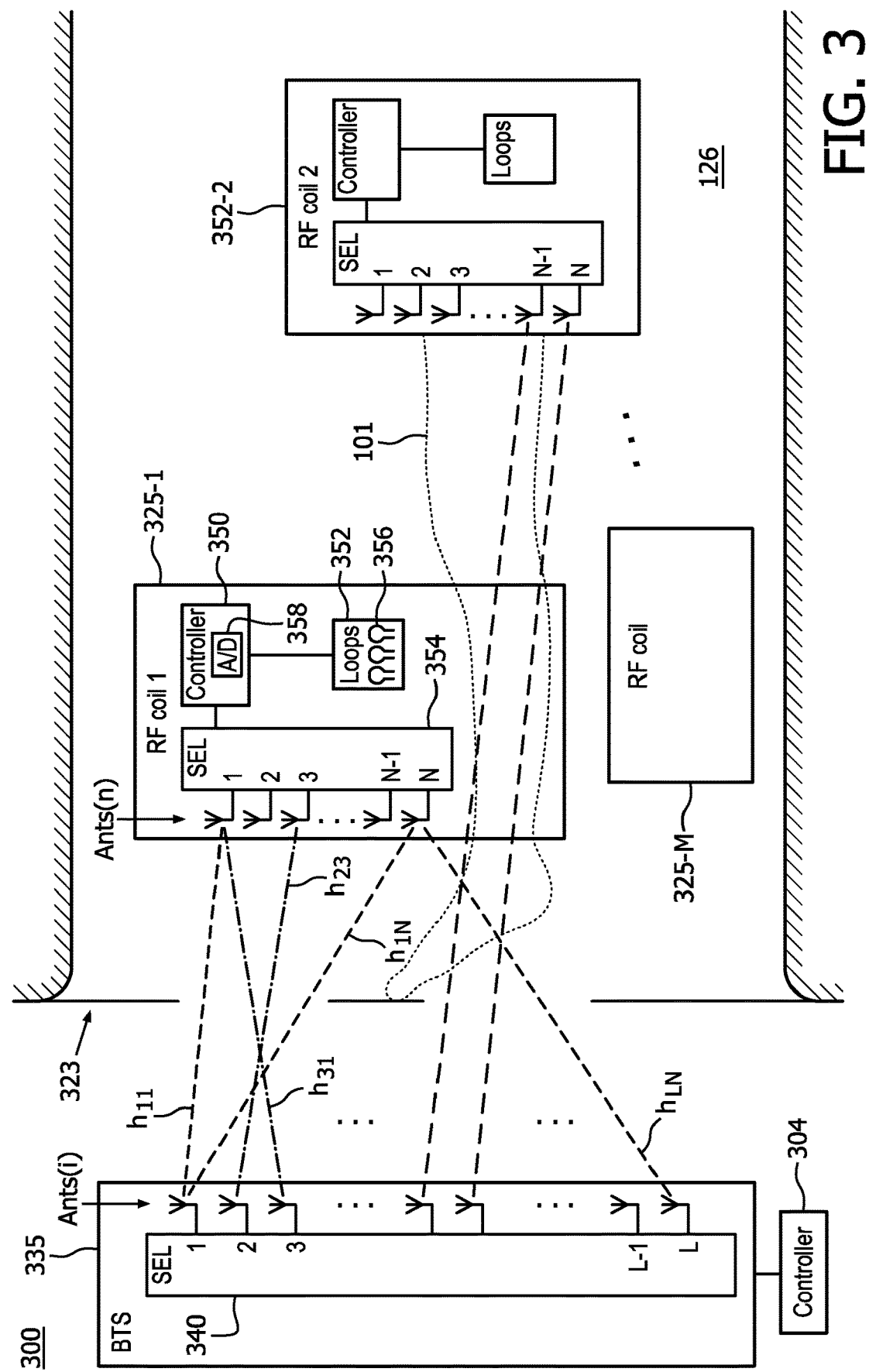
FIG. 3 shows a schematic block diagram of a portion of an MR system in accordance with embodiments of the present system.

FIG. 3 shows a schematic block diagram of a portion of an MR system 300 (hereinafter system 300 for the sake of clarity) in accordance with embodiments of the present system. The system 300 may be similar to the system 100 and may include one or more of a MRI body having a bore 126, an MRI system controller (controller) 304, a support portion to support the patient 101, a BTS 335, and an RF portion 323. Generally, the controller 304, the BTS 335, and the RF portion 323 may be similar to the controller 104, the BTS 135, and the RF portion 123 of the system 100, respectively. In accordance with embodiments of the present system, the controller 304 may control the overall operation of the system 300 and may include one or more BTSs illustratively shown as a BTS 335. For the sake of clarity, the BTS 335 is illustratively discussed herein. In accordance with the present invention, the illustrative example discussed herein however is understood to apply to a plurality of BTS which may be the same or similar to the BTS 335 as applicable, without further elaboration unless noted.

The BTS may include an antenna selector (SEL) device 340 and L transmit and/or receive (TRX) antennas such as ANT(1) through ANT(L) (generally ANTx), where L is an integer. The SEL 340 may select one or more antennas ANTs coupled thereto for transmission to other portions of the system 300 such as to the RF portion 324 under the control of the controller 304. Further, the selector 340 may selectively switch signals received from one or of the antennas ANTx coupled thereto and provide these received signals to the controller 304 for further processing. The received signals may include signals received from the RF portion 323.

The RF portion 323 may include a plurality of WRFs such as WRFs 325-1 through 325-M (generally 325-x), where M is an integer. One or more of the WRFs 325-x may be similar to, or different from, each other. Accordingly, for the sake of clarity a description of only the WRF 325-1 will be given with the assumption that the other WRFs 325-x may be similar to the WRF 325-1 unless the context indicates otherwise.

The WRF 325-1 may include a controller 350, an MR antenna loop array 352, an antenna selector (SEL) 354, and N transmit and/or receive (TRX) antennas ANT(n) such as ANTs(1) through ANT(N) (generally ANTx), where N is an integer. The controller 350 may control the overall operation of the WRF 325-1.

The antenna loop array 352 may include a plurality of receive loops 356 tuned to receive induced MR signals from the patient 101 and transit the received induced MR signals to the controller 350 for further processing such as for digitization using an analog-to-digital A/D converter 358 to form digitized MR information (raw information) and/or to form reconstructed MR information, as may be desired. The receive loops 356 may be numbered, shaped, sized, and/or located in accordance with an intended use of an RF coil (e.g., head coil, shoulder coil, knee coil, ankle coil, body coil, etc.) though a general shape that may apply to more than one application is also envisioned. One or more of the receive loops 356 may be selected for reception at any time under the control of the controller 350.

The selector 354 select one or more of the ANTs antennas for reception and/or transmission of signals under the control of the controller 350. For example, the selector 354 may receive signals received by one or more selected ANTx (e.g., control, synchronization, and/or sequence information transmitted from the BTS 335) and provide these signals to the controller 350 for further processing. Similarly, the selector 354 may select one or more ANTx to transmit control, synchronization, and/or digitized MR information (e.g., digitized MR and/or reconstructed MR information) to the BTS 335 under control of the controller 350.

At the BTS 335, the selector 340 may receive signals received by one or more selected ANTx coupled thereto and provide these signals to the controller 304 for further processing. Similarly, the selector 340 may select one or more ANTx to transmit control, synchronization, and/or sequence information to the WRF 325-1 under control of the controller 350. Thus, in accordance with embodiments of the present system, the selectors (e.g., 340, 354) may controllably select one or more antennas for transmission and/or reception of signals under the control of their respective controller (e.g., 304, 350).

During operation one or more selected antennas ANTx of the BTS 335 may be communicatively coupled to one or selected antennas ANTx of selected WRFs 325-x as shown by dotted lines $h_{11}$ through $h_{LN}$ which may represent communication couplings (couples) or a transmission matrix. Assuming the BTS may have L antennas and each WRF 325-x may have the N antennas, there may be N×M communication couplings. These couplings may be selected and/or changed at any time under the control of a controller such as the controller 304. As utilized herein, the term coupling is intended to indicate a communication path that is not exclusive of other paths (e.g., one ANTx of the BTS 335 coupled with two ANTx of selected WRFs 325-x, etc.). In accordance with embodiments of the present system, an original signal may be split for transmission among one or more antennas. Thereafter one or more antennas may receive the transmitted signal which may then be combined to form the original signal. In this way, transmission/reception capabilities may be optimized and selected based upon available couplings, bandwidth of the available couplings and requirements (e.g., timing, amount of data transmitted, etc.) of particular types of signals being transmitted. Accordingly, communicatively couplings for selected antennas ANTx may be evaluated to determine supported transmission methods as well as a quality of communication between antennas. For example, antenna pairings may be evaluated to be (a) a line-of-sight (LOS) pairing (e.g., potentially highest throughput path) such as coupling $h_{11}$; (b) direct path/direct signal, with obstruction such as coupling $h_{22}$; (c) multipath/indirect path with no substantial loss of signal such as coupling $h_{LN}$ and (d) reflected/scattered from an object (e.g., potentially lowest throughput path) such as for some antenna pairings of WRF 325-2 with BTS 335 due to WRF 325-1 and may then classify the corresponding antennas pairings accordingly. This classification may be utilized to select antenna pairings and communication methods to for example a data type being transmitted to support requirements (e.g., timing, amount of data transmitted, etc.). For example, out of available pairings, a LOS pairing may be selected for transmission of control information while a plurality of direct path/direct signal, with obstruction pairings may be selected to satisfy the transfer of high data rate data such as image data. Further, error correction data for example to support image data may be transmitted over a multipath/indirect pairing path. Naturally as readily appreciated, a LOS communication path for example may be utilized to support more than one transmitted data type (e.g., control data and image data) as long as desired antenna pairings are available to support throughput and deterministic requirements. Further, in accordance with embodiments of the present system, a given data type may be supported by more than one classification of pairings (e.g., partial LOS, partial obstructed path; partial LOS, partial multipath/indirect path; partial LOS, partial reflected/scattered from an object and other combination of LOS, direct path/direct signal with obstruction, multipath/indirect path and reflected/scattered pairings).

Figure 4A:
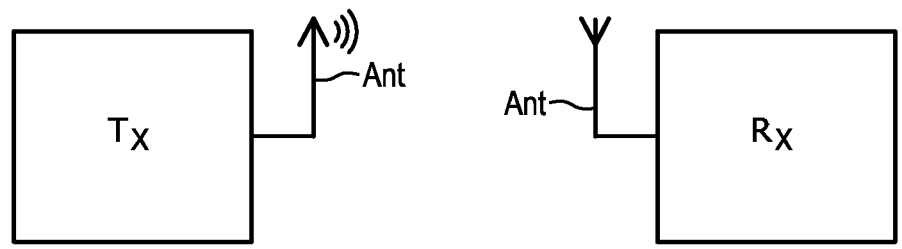
FIG. 4A shows a graphical representation of a SISO communication method operating in accordance with embodiments of the present system.
Figure 4B:
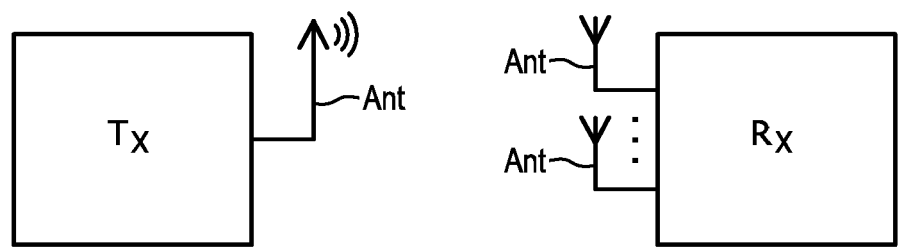
FIG. 4B shows a graphical representation of a SIMO communication method operating in accordance with embodiments of the present system.
Figure 4C:
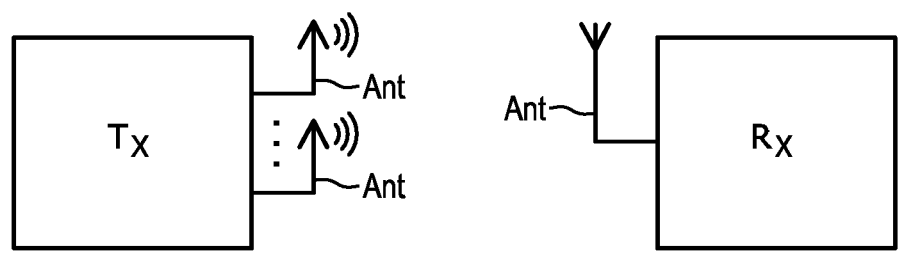
FIG. 4C shows a graphical representation of a MISO communication method operating in accordance with embodiments of the present system.
Figure 4D:
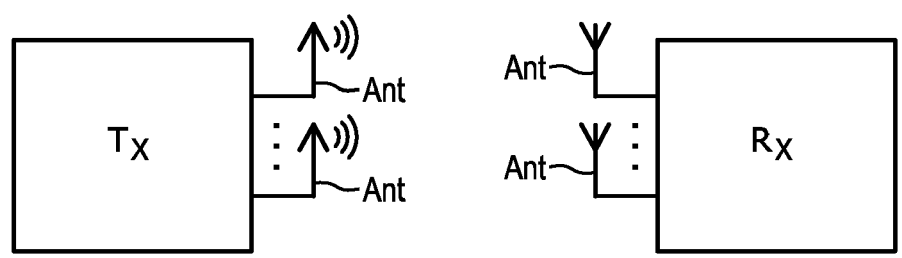
FIG. 4D shows a graphical representation of a MIMO communication method operating in accordance with embodiments of the present system.
Figure 5:
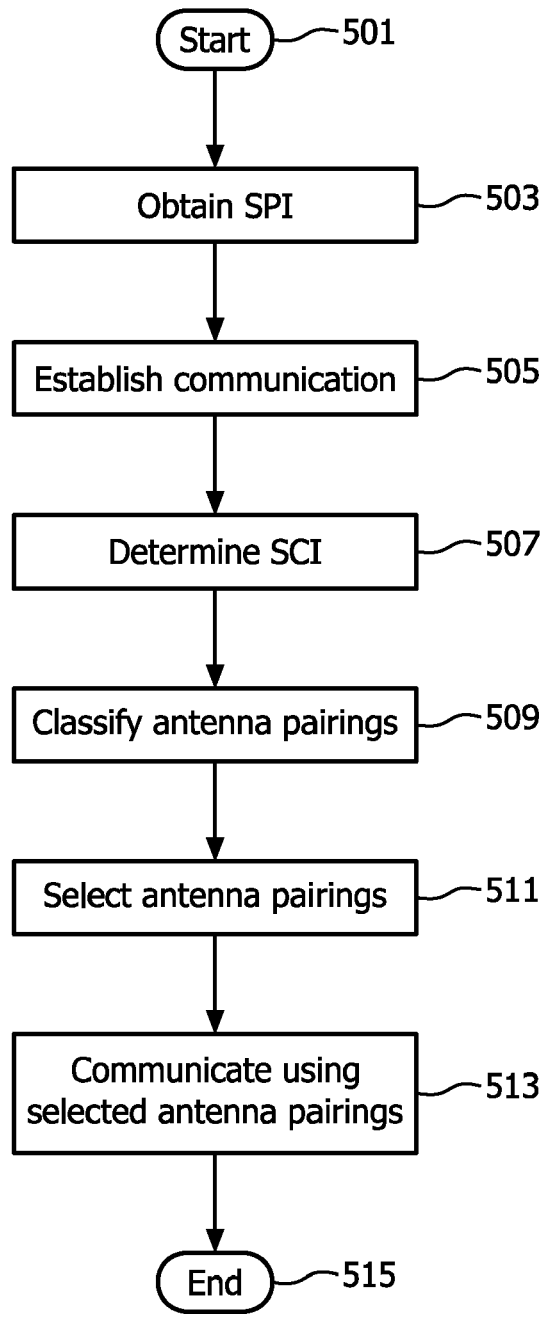
FIG. 5 shows a functional flow diagram of a process that may be performed in accordance with embodiments of the present system.

Further discussions of classification regarding antenna pair(s) selection are provided above and with reference to FIG. 5 for example for clarity. A graphical representation of SD communication methods used by embodiments of the present system is shown and described with reference to FIGS. 4A through 4D below, wherein: FIG. 4A shows a graphical representation of a Single-input single-output (SISO) communication method operating in accordance with embodiments of the present system; FIG. 4B shows a graphical representation of a Single-input multiple-output (SIMO) communication method operating in accordance with embodiments of the present system; FIG. 4C shows a graphical representation of a Multiple-input single-output (MISO) communication method operating in accordance with embodiments of the present system; and FIG. 4D shows a graphical representation of a Multiple-input multiple-output (MIMO) communication method operating in accordance with embodiments of the present system. In each of FIGS. 4A through 4C, a transmitter (Tx) and a receiver (Rx) and corresponding antennas (ANTS) are shown to simplify the discussion though the present system is readily applied in embodiments wherein more than a single transmitter and receiver are available as discussed herein.

FIG. 5 shows a functional flow diagram of a process 500 that may be performed for example by a processor as described in accordance with embodiments of the present system. The process 500 may be performed using one or more computers, processors, microcontrollers, etc., communicating over a network and may obtain information from, and/or store information to one or more memories which may be local and/or remote from each other. The process 500 may include one of more of the following acts and may be operative to establish a communication method between a BTS and one or more WRFs in accordance with embodiments of the present system. Further, one or more of these acts may be combined and/or separated into sub-acts, if desired. Further, one or more of these acts may be skipped depending upon settings. In operation, the process may start during act 501 and then proceed to act 503. Further, although the acts of the process 500 are described with respect to a single WRF for the sake of clarity, the acts of the process may be repeated for each of two or more of a plurality of WRFs in an MRI system which may be used to perform a scan (e.g., head, knee, shoulder RF coils, etc.).

During act 503, system process information (SPI) related to system processes for a current scan may be obtained. For example, the system processes may include one or more of a synchronization process, a sequence generation process, an image acquisition process, and a data transfer process. The SPI may include corresponding timing information and may be obtained from a memory of the system. The timing information may be utilized to set, correct or otherwise facilitate a synchronization between the BTS and the one or more WRFs as discussed herein in accordance with embodiments of the present system. Further, SPI may include transmission settings for each corresponding system process. For example, the synchronization process may be utilized to set a coil synchronization using a line-of-sight (LOS) communication method. The line-of-sight (LOS) communication method may utilize (e.g., tolerate) a threshold signal delay for example of less than 0.01 ms, while the data transfer process (e.g., to transfer digitized MR information) may utilize a communication method which uses the 3 fastest (in terms of throughput) antenna pairings or a number of antenna pairings to provide a throughput as may be defined by a throughput threshold (e.g., 1 Gbps).

In accordance with embodiments of the present system, the SPI may include desired SD communication methods selected from one or more of a SISO, SIMO, MISO, and MIMO communication methods. The system process information may be set by the user and/or system and stored in a memory of the system for later use. For the sake of clarity, it will be assumed that the SPI for the sequence generation process, the image acquisition process and the data transfer process are the same or similar to facilitate the discussion though may differ in accordance with embodiments of the present system. After completing act 503, the process may continue to act 505.

During act 505, communication may be established or attempted between a BTS having a plurality of antennas $ANTS_{BTS}$ and a WRF having a plurality of antennas $ANTS_{RF}$. A suitable SP communication method may be utilized that is supported by the antenna pairings such as a MIMO communication method. After completing act 503, the process may continue to act 505.

During act 505, wireless coupling is established and/or tested between ones of the plurality of antennas $ANTS_{BTS}$ of the BTS with ones of the plurality (e.g., test coupling of pairs) of antennas $ANTS_{RF}$ of the WRF. Thus, with reference to FIG. 3, assuming the BTS has L antennas and the WRF has N antennas, then there may be L×N antenna couplings (e.g., antenna pairings) which may be referred to as antenna pairings as discussed. Thus, for example, with reference to FIG. 3, each antenna pairing ($h_{nl}$) between one of the L antennas of the BTS and the N antennas of a corresponding WRF may have a corresponding index (e.g., $h_{nl}$) as shown to form N×L potential antenna pairings. Thus, the antenna pairings (h) may form an N×L pairing matrix. After completing act 505, the process may continue to act 507.

During act 507, signal characteristic information (SCI) may be determined for one or more of each antenna pairing $h_{nl}$. The SCI may include signal characteristics such as one or more of signal power loss, signal throughput, signal delay, signal stability (with respect to timing), etc. for each of the antenna pairings ($h_{nl}$). To determine signal characteristics, one or more signals may be transmitted in one or more directions between transmitting and receiving antennas in each pairing. Thereafter, these signals may be analyzed to determine the SCI. After completing act 507, the process may continue to act 509.

During act 509, one or more of each of the antennas pairings $h_{nl}$ may be classified. Accordingly, the process may analyze the SCI to determine whether the antenna pairings are for example one or more of (provided in potentially descending throughput order): (a) a line-of-sight (LOS) pairing (e.g., potentially highest throughput path); (b) direct path/direct signal, with obstruction; (c) multipath/indirect path with no substantial loss of signal; and (d) reflected/scattered from an object (e.g., potentially lowest throughput path) and may then classify the corresponding antennas pairings $h_{nl}$ accordingly. The SCI may be updated to reflect this information for one or more of the antennas pairings $h_{nl}$. and/or this information may be utilized to classify the individual antenna pairs for selection of antenna pairs based on suitability for transmitting given types of information as discussed herein. After completing act 509, the process may continue to act 511. During act 511, the process may select antenna pairings $h_{nl}$ for communication and/or SD communication methods for each system process as may be defined by the SPI.

For example, with respect to the synchronization process, the SPI for the synchronization process may require a LOS communication method with for example a threshold signal delay of less than 0.01 ms. This delay may provide for deterministic timing requirements as required for example by real-time-operating system (RTOS) control of a wireless coil such as to control operation and or timing of the wireless coil. Accordingly, the process may select one or more antenna pairings $h_{nl}$ which have been classified as a LOS pairing with a signal delay of less than 0.01 ms in accordance with the system process information based on the determined signal characteristics of antenna pairings (e.g., classification of antenna pairings as LOS, obstructed, etc.).

Similarly, antennas pairings $h_{nl}$ and/or SD communication modes for the data transfer process may be determined by selecting available antenna pairings $h_{nl}$ that satisfy throughput and timing requirements of a given signal type. For example, the 3 fastest (in terms of throughput) antenna pairings $h_{nl}$ as may be selected as high-data-rate (HDR) pairings to transmit HDR data such as image data. As used herein, HDR data may utilize a data rate which exceeds a data threshold such as >1 Gb/sec. It is further envisioned that the process may determine whether the 3 fastest antenna pairings can provide for a data rate which meets or is greater than the data threshold. In a case wherein it is determined that these 3 fastest antenna pairings can provide for a data rate that meets or is greater than the data threshold, then the process may select these 3 fastest antenna pairings as HDR pairings. However, in a case wherein it is determined that these 3 fastest antenna pairings do not provide for a data rate that meets or is greater than the data threshold, then the process may add more pairings to this group so that it may provide for a data rate that meets or is greater than the data threshold. Thus, the process may select antenna pairings (either singular pairings or a combination of pairings) that may meet certain throughput thresholds and/or timing requirements for example of a given information type to be transmitted.

The process may further determine an SD communication method (e.g., communication mode) (e.g., selected from one or of the MIMO, SIMO, SISO, and MISO communication methods) based upon the SCI and/or the selected antenna pairings $h_{nl}$. For example, in a case wherein two or more transmitting antennas and two or more receiving antennas are selected in each of the uplink and downlink directs between the BTS and the WRF, a MIMO communication mode may be selected.

Thus, with regard to the data transfer process, an SD communication method for this process may be determined in accordance with selected antenna pairings $h_{nl}$. For example, in a case wherein the three fastest antenna pairings $h_{nl}$ use at least two different transmit antennas and at least two different receive antennas, the process may select a MIMO communication method. However, in a case wherein the three fastest antenna pairings $h_{nl}$ use the same transmit antenna and at least two different receive antennas, the process may select a SIMO communication method. Similarly, in a case wherein the three fastest antenna pairings $h_{nl}$ use the same transmit antenna and the same receive antenna, the process may select a SISO communication method. Further, in a case wherein the three fastest antenna pairings $h_{nl}$ use at least two different transmit antennas and a single receive antenna, the process may select a MISO communication method. These illustrative methods shown above with respect to FIGS. 4A through 4D are not intended as exclusive considerations as others to facilitate transmissions between the antenna pairs and systems may also be suitably applied. Further, mixed communications such as selection of one or more LOS pairings together with one or more direct path/direct signal, with obstruction pairs may be selected to satisfy a transmission requirement (e.g., throughput). After completing act 511, the process may continue to act 513.

During act 513, the communication may be established using the selected antenna pairing(s) $h_{nl}$ and/or the selected SD communication method(s). Accordingly, communication may be established between the BTS and the WRF in accordance with the selected antenna pairings and selected SD communication method(s) for each corresponding system process (e.g., synchronization, a sequence generation, an image acquisition, and a data transfer processes, etc.). A scan may then be performed using the established antenna pairings and/or the selected SD communication methods for each system process. For example, in the present embodiments, the process may perform a synchronization process using a SISO communication mode with the determined antenna pairing(s) and may perform a sequence generation, an image acquisition, and a data transfer processes using a MIMO communication mode between the determined antenna pairing(s). It is further envisioned that the control and/or synchronization processes may use the antenna pairings that were determined to be RTOS pairings and may transmit HDR data using the pairings that were determined to be HDR pairings.

As readily appreciated, changes may occur between antenna pairings for example during use so in accordance with embodiments of the present system, one or more acts of the process may be repeated (e.g., one or more of acts 503, 505, 507, 509, 511 and 513) to update the antenna pairings should characteristics of the pairings change. In addition, as the data being transmitted between antenna pairings may also change over time, antenna pairings may be reclassified as changes occur (e.g., LOS changing to obstructed) for example as instrumentation is introduced or a patient moves during a scan.

After completing act 513, the process may continue to act 515 where the process may end.

Accordingly, embodiments of the present system may increase channel capacity by using spatial diversity. This may often be referred to as Multiple Input-Multiple Output (MIMO) communication method which may be employed by a MIMO communication mode operating in accordance with embodiments of the present system. Accordingly, embodiments of the present system may employ a communication system which may generate several signals that may propagate along the same channel using the same frequency and bandwidth, but may have different spatial distributions. Embodiments of the present system may further determine channel state information (CSI) at one or more of a receiver and a transmitter.

Embodiments of the present system may further employ one or more of precoding, beam forming, spatial multiplexing, and diversity coding methods during communication. These methods are discussed in further detail through the Internet at en.wikipedia.org/wiki/MIMO, the contents of which are incorporated herein by reference. In accordance with embodiments of the present system, these communication methods may be optimized by selecting/mixing the antenna pairs and communication methods there between to satisfy the diverse communication requirements for example of one or more WRFs (e.g., WRFs 125-*x*) as described herein.

Figure 6:
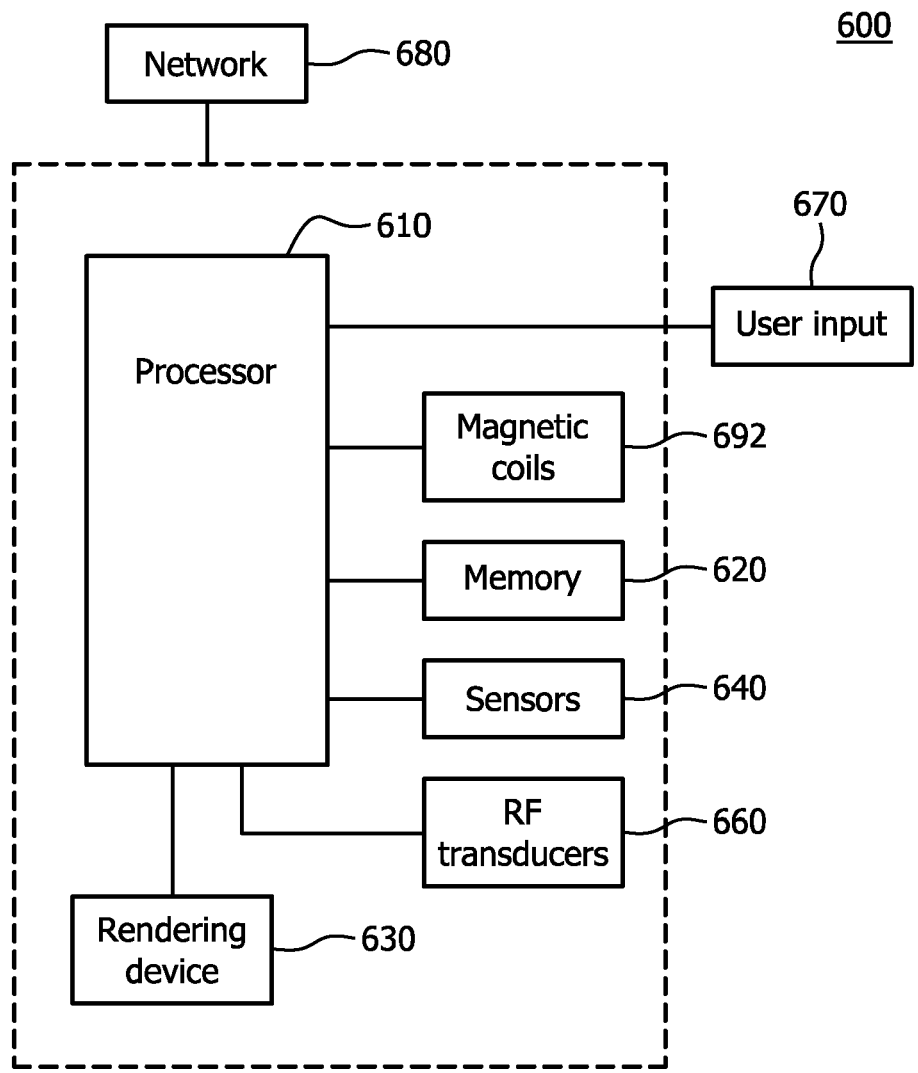
FIG. 6 shows a portion of a system in accordance with embodiments of the present system.

FIG. 6 shows a portion of a system 600 in accordance with embodiments of the present system. For example, a portion of the present system may include a processor 610 (e.g., a controller) operationally coupled to a memory 620, a user interface (UI) including a rendering device such as a display 630, sensors 640, an RF portion 660, magnetic coils 692, and a user input device 670. The memory 620 may be any type of device for storing application data as well as other data related to the described operation. The application data and other data are received by the processor 610 for configuring (e.g., programming) the processor 610 to perform operation acts in accordance with the present system. The processor 610 so configured becomes a special purpose machine particularly suited for performing in accordance with embodiments of the present system.

The operation acts may include the methods described herein including configuring an MRI system by, for example, controlling the magnetic coils 692, and/or the RF portion 660 in accordance with system settings. An optional location mechanism may control a physical location (e.g., in x, y, and z axes) of a patient and/or the RF portion 660, as desired. The RF portion 660 may be controlled by the processor 610 to control RF transducers such as RF transmission coils and RF reception coils, and RF states (modes) such as tune/detune and synchronization states. The RF portion 660 may include wired- and/or wireless-type RF portions which may be local and/or remote from each other. In accordance with embodiments, the RF portion 660 may include a wireless receive-type RF coil such as provided in one or more of a base, positioner and/or top portion. The magnetic coils 692 may include main magnetic coils, gradient coils ($G_R$) (e.g., x-, y-, and z-gradient coils), optional gradient shimming coils, and may be controlled to emit a main magnetic field ($B_0$) and/or gradient fields in a desired direction and/or strength (e.g., $G_x$, $G_y$, and $G_z$). The processor 610 may control one or more power supplies to provide power to the magnetic coils 692 so that a desired magnetic field is emitted at a desired time. The control may include selection of one or more antenna pairs and/or communication methods as described herein to satisfy an operation of the MRI such as one or more of synchronization, transmission of image information, control information, etc.

Further, the RF portion 660 may be controlled to transmit RF pulses and to receive induced MR signals. A processor or portion thereof operating as a reconstructor (e.g., processor 104, controller 350, remote system, etc.) suitably configured may process received signals such as the induced MR signals and transform these signals (e.g., using one or more reconstruction techniques of embodiments of the present system) into content which may include image information (e.g., still or video images (e.g., video information)), data, and/or graphs (e.g., spectrographic information) that may be rendered on, for example, a UI of the system such as on the display 630, a speaker, etc. Further, the content may then be stored in a memory of the system such as the memory 620 for later use. Thus, operation acts may include setup of one or more antenna pairs (see, FIG. 5), setup and control of a wireless RF coil, acquisition/transmission of image information, reconstruction and/or rendering of content such as, for example, reconstructed image information obtained from the induced MR information. The processor 610 may render the content such as image information on a UI of the system such as a display of the system.

The user input 670 may include a keyboard, a mouse, a trackball, or other device, such as a touch-sensitive display, which may be stand alone or part of a system, such as part of a personal computer, a personal digital assistant (PDA), a mobile phone (e.g., a smart phone), a monitor, a smart or dumb terminal or other device for communicating with the processor 610 via any operable link such as a wired and/or wireless communication link. The user input device 670 may be operable for interacting with the processor 610 including enabling interaction within a UI as described herein. Clearly the processor 610, the memory 620, display 630, and/or user input device 670 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 620 or other memory coupled to the processor 610.

The program and/or program portions contained in the memory 620 may configure the processor 610 to implement the methods, operational acts, and functions disclosed herein. The memories may be distributed, for example between the clients and/or servers, or local, and the processor 610, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 610. With this definition, information accessible through a network is still within the memory, for instance, because the processor 610 may retrieve the information from the network for operation in accordance with the present system.

The processor 610 is operable for providing control signals and/or performing operations in response to input signals from the user input device 670 as well as in response to other devices of a network and executing instructions stored in the memory 620. The processor 610 may include one or more of a microprocessor, an application-specific or general-use integrated circuit(s), a logic device, etc. Further, the processor 610 may be a dedicated processor for performing in accordance with the present system or may be a general-purpose processor wherein only one of many functions operates for performing in accordance with the present system. The processor 610 may operate utilizing a program portion, multiple program segments, or may be a hardware device utilizing a dedicated or multi-purpose integrated circuit. Embodiments of the present system may provide fast imaging methods to acquire and/or reconstruct images. Suitable applications may include imaging systems such as MRI systems.

Embodiments of the present system may provide for the unidirectional or bidirectional transmission of digital data for control and/or operation of a wireless MRI coils such as wireless RF coils or any other wireless device for example within a bore of MRI and/or MRS systems.

For example, embodiments of the present system may provide methods of wirelessly transferring MRI data such as induced MR signals (e.g., raw data), digitized induced MR signals, and/or reconstructed MR information from an MR RF coil (e.g., a WRF) to a system controller (e.g., an MRI scanner) of an MRI and/or MRS system. By using wireless MR coils, galvanic cables are not needed, which may simplify workflow, improve safety and reliability, and/or reduce overall cost. Additionally, aesthetics are improved.

Accordingly, embodiments of the present system may increase wireless channel capacity within a bore of an MRI system while providing required fidelity. Further, a total number of wireless MRI RF signals that may be transported across a channel with the required fidelity may be increased. Embodiments of the present system may increase channel capacity for example by increasing the number of RF signals that can be transmitted and/or improve the fidelity of those signals.

In accordance with embodiments of the present system, channel capacity may be increased by increasing channel bandwidth. However this may not always be possible, due to technological and/or regulatory limits. Accordingly, embodiments of the present system may increase channel capacity by employing one or more higher-order modulation schemes that may encode more bits-per-symbol. For example, embodiments of the present system may switch from BPSK (1 bit/symbol), to QPSK (2 bit/symbol), to 16 QAM (4 bit/symbol), to 64 QAM (6 bit/symbol), as desired to support transmission requirements, etc. Higher order modulation schemes may be employed though require higher channel SNR for the same BER, or may result in lower BER for same channel SNR. Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated;

i) the term "plurality of" an element includes two or more of the claimed element, and does not imply any particular range of number of elements; that is, a plurality of elements may be as few as two elements, and may include an immeasurable number of elements; and j) the term and/or and formatives thereof should be understood to mean that only one or more of the listed elements may need to be suitably present in the system in accordance with the claims recitation and in accordance with one or more embodiments of the present system.

The invention claimed is:

1. A magnetic resonance (MR) system, comprising:
at least one wireless radio-frequency (RF) coil comprising antenna loops for receiving induced MR signals and an antenna array comprising transmission (WTx) and reception (WRx) antennas;
a base transmitter system (BTS) having an antenna array (ANT)(i)) comprising a plurality of transmission (BTx) and reception (BRx) antennas configured to communicate with the at least one wireless RF coil using a selected spatial diversity (SD) transmission method; and
at least one controller configured to control the BTS and the at least one wireless RF coil and:
determine a number of at least one of the transmission and reception antennas available for communication between the BTS and the at least one wireless RF coil,
couple the plurality of transmission (BTx) and reception (BRx) antennas of the BTS to the transmission (WTx) and reception (WRx) antennas of the at least one wireless RF coil to form corresponding antenna pairings, and determine signal characteristic information (SCI) of each of the antenna pairings,
select an SD transmission method for communicating with the at least one wireless RF coil based upon the determined number of transmission and reception antennas and the determined SCI to enable communication of a given type of information between the BTS and the at least one wireless RF coil, and establish at least one communication channel between the BTS and the at least one wireless RF coil in accordance with the selected SD transmission method.

2. The system of claim 1, wherein the at least one controller is further configured to determine the selected SD transmission method from at least one of a multiple-input multiple-output (MIMO), a multiple-input single-output (MISO), a single-input multiple-output (SIMO); and a single-input single-output (SISO) transmission methods in accordance with the determined number of antennas at the at least one wireless RF coil for enabling communication between the BTS and the at least one wireless RF coil.

3. The system of claim 1, wherein the at least one controller is further configured to: select one of the MISO and SISO communication methods when it is determined that the number of available transmission and reception antennas is not greater than one; and
select one of the MIMO and SIMO communication methods when it is determined that the number of available transmission and reception antennas is greater than one.

4. The system of claim 1, wherein the at least one controller is further configured to classify the available antenna pairings and select antenna pairings based upon the classification of the available antenna pairings.

5. The system of claim 4, wherein the at least one controller is further configured to determine a type of information to be transmitted between the BTS and the at least one wireless RF coil and select available antenna pairings with a given classification that is suitable for the determined type of information to be transmitted.

6. The system of claim 5, wherein one or more antenna pairings classified as line-of-sight are selected for transmitting real-time-operating-system (RTOS) information and one or more antenna pairing classified as direct path/direct signal, with obstruction are selected for transmitting high-data-rate (HDR) information.

7. A method of operating a magnetic resonance (MR) system, the method controlled by at least one controller (104, 304, 610), the method comprising:
receiving induced MR signals from at least one wireless radio-frequency (RF) coil comprising antenna loops and an antenna array comprising transmission (WTx) and reception (WRx) antennas;
communicating between the at least one wireless RF coil and a base transmitter system (BTS) having an antenna array (ANT)(i)) comprising a plurality of transmission (BTx) and reception (BRx) antennas using a selected spatial diversity (SD) transmission method;
determining a number of at least one of the transmission and reception antennas available for communication between the BTS and the at least one wireless RF coil, coupling the plurality of transmission (BTx) and reception (BRx) antennas of the BTS to the transmission (WTx) and reception (WRx) antennas of the at least one wireless RF coil to form corresponding antenna pairings; determining signal characteristic information (SCI) of each of the antenna pairings;
selecting an SD transmission method for communicating with the at least one wireless RF coil based upon the determined number of transmission and reception antennas and the determined SCI to enable communication of a given type of information between the BTS and the at least one wireless RF coil;
establishing at least one communication channel between the BTS and the at least one wireless RF coil in accordance with the selected SD transmission method; and
transmitting the received MR signals between the at least one RF coil and the BTS on the at least one established communication channel.

8. The method of claim 7, further comprising determining the selected SD transmission method from at least one of a multiple-input multiple-output (MIMO), a multiple-input single-output (MISO), a single-input multiple-output (SIMO); and a single-input single-output (SISO) transmission methods in accordance with the determined number of antennas at the at least one wireless RF coil for enabling communication between the BTS and the at least one wireless RF coil.

9. The method of claim 7, further comprising:
selecting one of the MISO and SISO communication methods when it is determined that the number of available transmission and reception antennas is not greater than one; and
selecting one of the MIMO and SIMO communication methods when it is determined that the number of available transmission and reception antennas is greater than one.

10. The method of claim 7, further comprising:
classifying the available antenna pairings, and
selecting antenna pairings based upon the classification of the available antenna pairings.

11. The method of claim 10 further comprising:
determining a type of information to be transmitted between the BTS and the at least one wireless RF coil, and
selecting available antenna pairings with a given classification that is suitable for the determined type of information to be transmitted.

12. The method of claim 11 further comprising:
selecting one or more antenna pairings classified as line-of-sight for transmitting real-time-operating-system (RTOS) information, and
selecting one or more antenna pairing classified as direct path/direct signal, with obstruction for transmitting high-data-rate (HDR) information.

13. A computer program stored on a computer readable non-transitory memory medium (110, 620) for a magnetic resonance (MR) system, the computer program comprising computer program instructions that when executed by a processor (104, 304, 610) cause the processor to perform a method comprising:
receiving induced MR signals from at least one wireless radio-frequency (RF) coil (125-$x$, 325-$x$, 660) comprising antenna loops (352) and an antenna array comprising transmission (WTx) and reception (WRx) antennas;
communicating between the at least one wireless RF coil and a base transmitter system (BTS) having an antenna array comprising a plurality of transmission (BTx) and reception (BRx) antennas using a selected spatial diversity (SD) transmission method; determining a number of at least one of the transmission and reception antennas available for communication between the BTS and the at least one wireless RF coil; coupling the plurality of transmission (BTx) and reception (BRx) antennas of the BTS to the transmission (WTx) and reception (WRx) antennas of the at least one wireless RF coil to form corresponding antenna pairings;
determining signal characteristic information (SCI) of each of the antenna pairings;
selecting an SD transmission method for communicating with the at least one wireless RF coil based upon the determined number of transmission and reception antennas and the determined SCI to enable communication of a given type of information between the BTS and the at least one wireless RF coil;
establishing at least one communication channel between the BTS and the at least one wireless RF coil in accordance with the selected SD transmission method; and
transmitting the received MR signals between the at least one RF coil and the BTS on the at least one established communication channel.

14. The computer program of claim 13, further comprising: determining the selected SD transmission method from at least one of a multiple-input multiple-output (MIMO), a multiple-input single-output (MISO), a single-input multiple-output (SIMO); and a single-input single-output (SISO) transmission methods in accordance with the determined number of antennas at the at least one wireless RF coil for enabling communication between the BTS and the at least one wireless RF coil.

15. The computer program of claim 13, further comprising:
selecting one of the MISO and SISO communication methods when it is determined that the number of available transmission and reception antennas is not greater than one; and selecting one of the MIMO and SIMO communication methods when it is determined that the number of available transmission and reception antennas is greater than one.

16. The computer program of claim 13, further comprising:
classifying the available antenna pairings, and
selecting antenna pairings based upon the classification of the available antenna pairings.

17. The computer program of claim 16, further comprising:
determining a type of information to be transmitted between the BTS and the at least one wireless RF coil, and
selecting available antenna pairings with a given classification that is suitable for the determined type of information to be transmitted.

18. The computer program of claim 17, further comprising:
selecting one or more antenna pairings classified as line-of-sight for transmitting real-time-operating-system (RTOS) information, and
selecting one or more antenna pairing classified as direct path/direct signal, with obstruction for transmitting high-data-rate (HDR) information.

* * * * *